(12) United States Patent
Rajavel et al.

(10) Patent No.: US 7,755,023 B1
(45) Date of Patent: Jul. 13, 2010

(54) ELECTRONICALLY TUNABLE AND RECONFIGURABLE HYPERSPECTRAL PHOTON DETECTOR

(75) Inventors: Rajesh D. Rajavel, Oak Park, CA (US); David H. Chow, Newbury Park, CA (US); Andrew T. Hunter, Woodland Hills, CA (US)

(73) Assignee: HRL Laboratories, LLC, Malibu, CA (US)

(*) Notice: Subject to any disclaimer, the term of this patent is extended or adjusted under 35 U.S.C. 154(b) by 294 days.

(21) Appl. No.: 11/869,681

(22) Filed: Oct. 9, 2007

(51) Int. Cl.
*G01J 5/20* (2006.01)
*H01L 31/00* (2006.01)

(52) U.S. Cl. ............... 250/214.1; 250/338.4; 257/189; 257/191; 257/442

(58) Field of Classification Search ........... 250/214.1, 250/338.4, 339.01, 339.02, 339.05; 257/184, 257/188, 189, 190, 191, 441, 442
See application file for complete search history.

(56) References Cited

U.S. PATENT DOCUMENTS

| | | | | |
|---|---|---|---|---|
| 3,924,150 A * | 12/1975 | Wasa et al. | ............... | 327/514 |
| 3,995,303 A * | 11/1976 | Nahory et al. | ............... | 257/184 |
| 4,729,004 A * | 3/1988 | Sakai et al. | ............... | 257/189 |
| 5,075,750 A | 12/1991 | Kagawa | | |
| 5,466,953 A * | 11/1995 | Rosbeck et al. | ............... | 257/185 |
| 5,731,621 A * | 3/1998 | Kosai | ............... | 257/440 |
| 5,880,510 A * | 3/1999 | Cockrum et al. | ............ | 257/442 |
| 6,504,222 B1 | 1/2003 | Miyamoto et al. | | |
| 6,803,557 B1 | 10/2004 | Taylor et al. | | |
| 6,805,744 B2 * | 10/2004 | Kim et al. | ............... | 117/94 |
| 6,921,897 B1 | 7/2005 | Martin | | |
| 7,368,765 B1 * | 5/2008 | Rajavel et al. | ............ | 257/198 |
| 7,372,084 B1 * | 5/2008 | Rajavel et al. | ............ | 257/198 |
| 7,459,730 B1 * | 12/2008 | Kinch | ............... | 257/188 |
| 7,504,672 B1 * | 3/2009 | Kinch | ............... | 257/185 |
| 7,569,872 B1 * | 8/2009 | Rajavel et al. | ............ | 257/198 |
| 2001/0040244 A1 * | 11/2001 | Fitzgerald et al. | ............ | 257/191 |
| 2002/0195677 A1 | 12/2002 | Razeghi | | |
| 2003/0178636 A1 * | 9/2003 | Kwan et al. | ............... | 257/186 |
| 2006/0273421 A1 * | 12/2006 | Yasuoka et al. | ............ | 257/438 |
| 2008/0111152 A1 * | 5/2008 | Scott et al. | ............... | 257/188 |
| 2008/0173895 A1 * | 7/2008 | Maa et al. | ............... | 257/191 |

OTHER PUBLICATIONS

DeWames, et al., "An assessment of HgCdTe and GaAs/GaAlAs technologies for LWIR infrared imagers," 1992, the Proceedings of SPIE, vol. 1735, pp. 2-16.

(Continued)

*Primary Examiner*—John R Lee
(74) *Attorney, Agent, or Firm*—Christie, Parker, Hale

(57) ABSTRACT

Electronically tunable and reconfigurable hyperspectral IR detectors and methods for making the same are presented. In one embodiment, a reconfigurable hyperspectral sensor (or detector) detects radiation from about 0.4 μm to about 2 μm and beyond. This sensor is configured to be compact, and lightweight and offers hyperspectral imaging capability while providing wavelength agility and tunability at the chip-level. That is, the sensor is used to rapidly image across diverse terrain to identify man-made objects and other anomalies in cluttered environments.

15 Claims, 8 Drawing Sheets

OTHER PUBLICATIONS

Gunapala, et al., "InP based quantum well infrared photodetectors," 1991, the Proceedings of SPIE, vol. 1541, pp. 11-23.

Jelen, et al., "Multi-color 4-20 μm InP-based quantum well infrared photodetectors," 1999, the Proceedings of SPIE, vol. 3629, pp. 147-154, Jan. 1999.

Li, et al., "A two-stack, three-color quantum well infrared photodetector for mid-and long-wavelength infrared detection," 2002, the Proccedings of SPIE, vol. 4721, pp. 204-211.

Sundaream, et al., "2-color QWIP FPAs," 2000, the Proceedings of SPIE, vol. 4028, pp. 311-317.

Office action of Feb. 9, 2009 for U.S. Appl. No. 11/868,915.

* cited by examiner

ELECTRONICALLY TUNABLE AND RECONFIGURABLE HYPERSPECTRAL PHOTON DETECTOR

FIELD OF THE INVENTION

The invention relates generally to photon detectors and methods for making the same. More particularly, the invention relates to electronically tunable and reconfigurable hyperspectral photon and/or infrared (IR) detectors and methods for making the same.

BACKGROUND OF THE INVENTION

Imaging systems that detect various electromagnetic radiation spectral bands, including the visible band throughout the infrared band, are used in a variety of applications, such as detection of chemical or biological media, damage assessment of underground structures, foliage penetration to detect peoples and vehicles, etc. One type of image system may use a focal plane array (FPA) to detect infrared radiation. An FPA may be formed from an array of detector elements, such as infrared detector elements, wherein each of the infrared detector elements functions as a pixel to produce an image of the detected items. The change in signal level output of each of the infrared detector elements due to interaction with incident infrared radiation is converted into a multiplexed (or time multiplexed) electrical signal by a read out integrated circuit (ROIC).

Detection and identification of concealed targets and materials are significantly enhanced by exploiting the spectral features in the imaged scene. In multispectral imaging (MSI), multiple images of a scene or object are created using radiation from different parts of the spectrum. If the proper wavelengths are selected; multispectral images can be used to detect many important items such as camouflage, thermal emissions and hazardous wastes to name a few. Hyperspectral imaging (HSI) spectrally resolves an image into tens to hundreds of bands to enable a even more reliable discrimination and can also be used to analyze the characteristics of unknown materials.

Current hyperspectral image systems (detectors or sensors) incorporate filters and dispersive optics or interferometers to generate spectral information, and tend to be expensive, large and heavy. Also, these image systems typically operate in the scan mode. In reconnaissance applications, it is desirable for a spectral image system to be compact, and light. In addition, it is desirable for a spectral image system that can operate in the stare (as opposed to scan) mode, and image over a select set of wavelength bands to avoid image blur and synchronization issues. It is further desirable for an array of staring detectors that can accommodate large optical apertures, and thus minimize data acquisition times, which is an important criterion when imaging over narrow line-widths.

A typical hyperspectral image system that has filters and dispersive optics cannot be operated in a broadband mode such as that needed for night vision applications. As such, there is a need for an improved detector array (e.g., an infrared detector array) that can resolve radiation from different parts of the spectrum and can also operate in the broadband mode (i.e., that can operate either in the hyperspectral mode or the broadband mode).

SUMMARY OF THE INVENTION

Aspects of the present invention provide electronically tunable and reconfigurable hyperspectral IR detectors and methods for making the same. One aspect of the present invention provides a reconfigurable hyperspectral sensor (or detector) for the detection of radiation from about 0.4 μm to about 2 μm and beyond. This sensor is configured to be compact, lightweight and offers hyperspectral imaging capability while providing wavelength agility and tunability at the chip-level. That is, the sensor is used to rapidly image across diverse terrain to identify man-made objects and other anomalies with ill-defined characteristics, in an autonomous manner with minimum space, weight, power and computational requirements.

In an embodiment of the present invention, a photon detector includes a semiconductor graded absorber layer, a semiconductor collector layer, and a semiconductor selector layer. The semiconductor graded absorber layer is adapted to generate charge carriers through interaction with infrared (IR) radiation, the graded absorber layer having a composition grade. The semiconductor collector layer is adapted to collect the charge carriers. The semiconductor selector layer is adapted to selectively deplete the absorber layer, the selector layer having a same doping type as the collector layer and an opposite doping type as the absorber layer. In this embodiment, the composition grade of the absorber layer is away from the selector layer such that a narrower band gap absorber material is closer to the collector layer and a wider band gap absorber material is closer to the selector layer, and the magnitude of the reverse bias applied to a p/n junction composed of the selector layer and the absorber changes the spectral response of the detector.

In one embodiment, the graded absorber layer contacts the collector layer and the selector layer, and/or the graded absorber layer is interposed between the collector layer and the selector layer.

In one embodiment, the electromagnetic radiation to be detected enters the absorber layer through the selector layer.

In one embodiment, independent electrical contacts are respectively made to the selector layer, the absorber layer, and the collector layer, forming a three terminal device, to permit the biasing of two p/n junctions independently.

In one embodiment, the electrical contact made to the absorber layer is used to remove either holes or electrons associated with photogenerated carriers and noise current within the depletion region of the absorber.

In one embodiment, the dopant concentration in the selector and collector layers are from 100 to 1000 fold higher than that in the absorber layer.

In one embodiment, the photon detector further includes a readout integrated circuit (ROIC) electrically coupled to the collector layer, and/or a bias voltage source electrically coupled to the selector layer and the graded absorber layer and adapted to tune a depletion width of the graded absorber layer.

In one embodiment, the selector layer is configured to selectively deplete the graded absorber layer to selectively detect an infrared wavelength.

In one embodiment, the photon detector includes an array of detector elements that are combined to form a focal plane array.

In one embodiment, a different magnitude of bias may be applied to a subset of the detector elements of the array to provide wavelength tunability at a pixel level, to acquire information associated with multiple wavelengths in a simultaneous manner.

In one embodiment, the graded absorber layer can be either step-graded or linearly graded and/or includes multiple layers of materials.

In one embodiment, the photon detector further includes a substrate. Here, the selector layer is on the substrate, the graded absorber layer is on the selector layer, and the collector layer is on the graded absorber layer.

In one embodiment, the graded absorber layer is composed of substantially of $InGa_{1-x}Al_xAs$, wherein x ranges from 0 to 1.

In another embodiment of the present invention, a photon detector includes a semiconductor graded absorber layer, a semiconductor collector layer, and a semiconductor selector layer. The semiconductor graded absorber layer is adapted to photo-generate charge carriers, the graded absorber layer having a composition grade. The semiconductor collector layer is adapted to collect the photo-generated charge carriers. The semiconductor selector layer is adapted to selectively deplete the absorber layer, the selector layer having a same doping type as the collector layer and an opposite doping type as the absorber layer. Here, the composition grade of the absorber layer is away from the selector layer such that a narrower band gap absorber material is closer to the collector layer and a wider band gap absorber material is closer to the selector layer, and the magnitude of the reverse bias applied to a p/n junction composed of the selector layer and the absorber changes the spectral response of the detector.

In one embodiment, the selector layer is formed on a substrate, and the substrate is removed to extend a detection range of the photon detector to detect a visible light.

In one embodiment, the substrate can include a buffer layer to accommodate a lattice mismatch between the substrate and the selector layer.

In one embodiment, a part of the graded absorber layer is composed of substantially of $In_{0.525}Ga_{1-x}Al_xAs$, wherein x ranges from 0 to 0.475.

In one embodiment, a part of the graded absorber layer is composed of substantially of an alloy of $In_xGa_{1-x}As_yP_{1-y}$, that is lattice matched to InP In one embodiment, N could be alloyed with the absorber material such as InGaAs, to reduce the band gap of the alloy.

In one embodiment, a part of the graded absorber layer is composed of substantially of an alloy of $In_xGa_{1-x}Sb_yAs_zN_{1-y-z}$, that is lattice matched to InP In one embodiment, a part of the graded absorber layer is composed of substantially of $Al_xGa_{1-x}As_ySb_{1-y}$, with a band gap ~2 eV and closely lattice matched to InP.

In one embodiment, a part of graded absorber layer is composed of substantially of $In_xAl_{1-x}As_ySb_{1-y}$, with a band gap of ~1.8 eV and closely lattice matched to InP In one embodiment, a part the graded absorber layer is composed of substantially of $In_xAl_{1-x}As$, wherein x is about 0.52.

In one embodiment, a first part of the graded absorber layer is composed of substantially of $In_{0.525}Ga_{1-x}Al_xAs$, wherein x ranges from 0 to 0.475; a second part of the graded absorber layer is composed of substantially of $In_eAl_{1-e}As$, wherein e is about 0.52; a third part of graded absorber layer is composed of substantially of $In_cAl_{1-c}As_dSb_{d-1}$, wherein c is about 0.31 and d is about 0.82; and/or a fourth part the graded absorber layer is composed of substantially of $Al_aGa_{1-a}As_bSb_{b-1}$, wherein a is about 0.75 and b is about 0.55

In one embodiment, a part the graded absorber layer is composed of substantially of an alloy of $Hg_{1-x}Cd_xTe$ wherein x ranges from 0.18 to 1.0.

In one embodiment, a part the graded absorber layer is composed of substantially of GaN, and/or one or more elements chosen from In, Al and As, alloyed with GaN.

In yet another embodiment of the present invention, a method to acquire hyperspectral and/or broadband imagery is provided. The method includes: applying a first reverse bias voltage between a semiconductor selector layer and a semiconductor graded absorber layer; and collecting a first charge carrier current associated with interaction of radiation of first wavelength range with the graded absorber layer through a semiconductor collector layer.

In one embodiment, the method further includes: applying a second reverse bias voltage between the selector layer and the graded absorber layer; collecting a second charge carrier current associated with interaction of radiation of second wavelength range with the graded absorber layer through the collector layer; and subtracting the second charge carrier current from the first charge carrier current.

In one embodiment, the method further includes: applying a third reverse bias voltage between the selector layer and the graded absorber layer; collecting a third charge carrier current associated with interaction of radiation of third wavelength range with the graded absorber layer through the collector layer; and subtracting the third charge carrier current from the second charge carrier current to determine the current associated with radiation whose wavelength range is the difference between the third wavelength range and the second wavelength range.

In one embodiment of the method, the first bias voltage is a small positive voltage, the second reverse bias voltage is lower in voltage level than the first reverse bias voltage, and the third reverse bias voltage is lower in voltage level than the second reverse bias voltage. The second and third bias voltages may have negative values.

In one embodiment of the method, the bias voltages are periodically swept in a continuous manner between approximately 0V and a voltage value needed to deplete the absorber layer.

A more complete understanding of the electronically tunable and reconfigurable hyperspectral photon (and/or IR) detector and the methods for making the same will be afforded to those skilled in the art, as well as a realization of additional advantages and objects thereof, by a consideration of the following detailed description. Reference will be made to the appended sheets of drawings which will first be described briefly.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
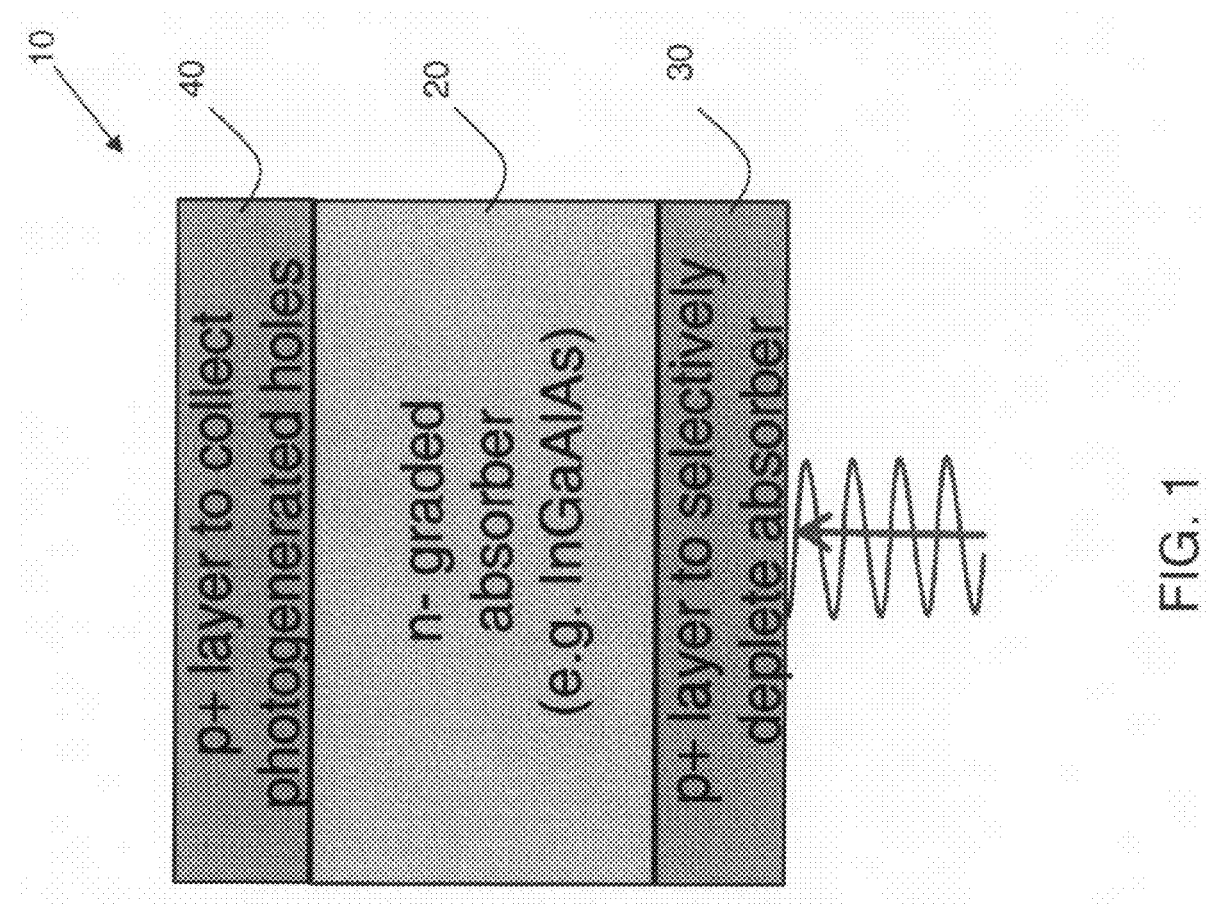
FIG. 1 is a schematic diagram of a photon detector pursuant to aspects of the present invention.

The invention is described below, with reference to detailed illustrative embodiments. It will be apparent that the invention can be embodied in a wide variety of forms, some of which may be quite different from those of the disclosed embodiments. Consequently, the specific structural and functional details disclosed herein are merely representative and do not limit the scope of the invention.

An embodiment of the present invention provides a reconfigurable hyperspectral sensor (or detector) for the detection of radiation from about 0.4 μm to about 2 μm and beyond. This sensor is configured to be compact, lightweight and offers hyperspectral imaging capability while providing wavelength agility and tunability at the chip-level. That is, the sensor is used to rapidly image across diverse terrain to identify man-made objects and other anomalies with ill-defined characteristics, in an autonomous manner with minimum space, weight, power and computational requirements.

The sensor according to an embodiment of the present invention has the ability to detect over two (2) octaves of wavelength range. By contrast, MEMS-based solutions are typically limited to only one (1) octave wavelength range. The added detector bandwidth is needed for optimal object discrimination. The detector is reconfigurable, and can be operated in broadband mode for night-vision applications.

Typically, a typical p-on-n photovoltaic detector is composed of an n– absorber, and a p+ hole collection layer. In accordance with an embodiment of the present invention, a detector includes a graded bandgap n– absorber layer p+ selector layer that serves to selectively deplete the absorber layer, and a second p+ collector layer. In this embodiment of the present invention, the detector is a three-terminal $p^+$-$n^-$-$p^+$ device, with individual contacts made to the selector, absorber and the collector layers. The grading in the absorber and the dependence of the absorption coefficient on the wavelength result in the absorption of shorter wavelength photons closer to the incidence surface, and longer wavelength photons deeper in the absorber. When a small reverse bias is applied to the p+ selector layer/n– absorber junction, the depletion region in the absorber is narrowed, and the electric field in the depletion region results in the selective collection of photogenerated holes associated with shortwave photons at the $p^+$ selector/$n^-$ absorber junction. With increasing reverse bias on the p+ selector layer/n– absorber, the depletion region encroaches deeper into the absorber, thereby collecting holes associated with longer wavelength photons. The electrons that are photogenerated within the depletion region are removed through the contact made to the absorber (280 in FIG. 5, 380a, b in FIG. 6, and 480 in FIG. 7) which is connected to the positive terminal of the bias voltage source. In this manner, the photogenerated electrons as well as any noise components from the depletion region are blocked (or prevented) from reaching the readout circuit, and do not constitute the detector signal. Here, the present invention is a 3 terminal device which provides advantage of low dark current, since the carriers, both holes and electrons that are generated within the heavily reverse biased depletion region of the absorber do not constitute the detector signal at the collector layer The holes that are generated outside the depletions regions are the ones that contribute to the detector signal at the collector layer.

Hyperspectral imagery is acquired by sweeping the bias on the p+ selector layer/n– absorber and performing simple subtractive signal processing of the detector photocurrent. On the other hand, broadband or multicolor imagery can be acquired by applying a fixed reverse bias on p+ selector layer/n– absorber.

Alternatively, if no electrical contact were made to the n-type graded absorber, the electrons that are generated within the depleted absorber region constitute the photocurrent, or detector signal. This alternative approach results in increased detector noise associated with undesirable generation-recombination current and tunneling current in a reversed bias junction. Since no electrical contact is made to the absorber, this noise component can not be eliminated. As such, since the above described embodiment of the present invention utilizes the contact to the absorber layer (280 in FIG. 5, 380a, b in FIG. 6, and 480 in FIG. 7) that is connected to the bias voltage supply source, the above described embodiment of the present invention can eliminate the undesirable noise associated with undesirable generation-recombination current and tunneling current in a reversed bias junction.

Significant benefit can be achieved by developing a compact staring FPA that provides spectral agility and tunability which can be used on platforms having limited size, weight, and power budgets. In one embodiment of the present invention, the sensor provides for spectral imaging at the chip-level, and offers:

Compact, lightweight size and no moving parts;

Hyperspectral tunability over >1 octave of detection wavelength;

Reconfigurable bandwidth: hyperspectral or broadband modes of operation;

Spatially registered, temporally sequential spectral images;

Compatiblility with large aperture optics for quick data acquisition; Detection in the VIS-NIR-SWIR for identifying manmade or camouflaged targets; and/or Pixel level wavelength-tunability by applying a bias at the pixel level Simultaneous acquisition of multi-spectral data, with neighboring pixels biased at different voltage and tuned to detect different wavelengths of radiation Hyperspectral imaging has a wide range of applications including surveillance, reconnaissance, target recognition, geological survey and law enforcement in areas such as airborne detection of illegal crops and release of chemicals used in the production of illegal/controlled substances.

As discussed above, the typical hyperspectral sensors incorporate filters and dispersive optics or interferometers to generate spectral information, and tend to be expensive, large and heavy. In reconnaissance applications, it is desirable for a spectral image sensor to operate in the staring (as opposed to scanning) mode, and to image over a select set of wavelength bands to avoid image blur and synchronization issues. Unlike acousto-optic tunable filter (AOTF) based imagers, which use f/10 optics, a staring array according to an embodiment of the present invention can accommodate large optical apertures, and thus minimize data acquisition times, which is useful when imaging over narrow line-widths. In addition, the sensor according to an embodiment of the present invention provides a tuning range that is over 2 octaves, and hence can span a wide detection range. Further, because the sensor according to an embodiment of the present invention does not use MEMS filter fabricated onto the FPA, the sensor according to the embodiment of the present invention can be operated in a broadband mode such as that needed for night vision applications.

FIG. 1 is a schematic of a hyperspectral detector 10 that utilizes a graded absorber 20 and p+ selector layer 30 at the bottom of the graded absorber 20. The field in the depleted graded absorber 20 results in the selective collection of holes associated with the shorter wavelengths.

In more detail, the detector 10 includes a semiconductor graded absorber layer that is adapted to function as the graded absorber 20 to generate charge carriers though interaction with photon radiation (e.g., infrared (IR) radiation). Here, the graded absorber layer is graded in composition. In the embodiment as shown in FIG. 1, the graded absorber layer is an n-graded layer.

In addition, the detection includes a semiconductor collector layer 40 adapted to collect the charge carriers, and a semiconductor selector layer 30 adapted to selectively deplete the absorber layer. In one embodiment, the collector layer 40 is adapted to collect photogenerated holes. Here, the selector layer 30 has a same doping type as the collector layer 40, and an opposite doping type as the absorber layer. For example, in the embodiment as shown in FIG. 1, the selector layer 30 is doped to be a p+ layer, and the collector layer 40 is also doped to be a p+ layer. Epitaxial growth techniques such as MBE (molecular beam epitaxy) or MOCVD (metalorganic chemical vapor deposition) is utilized to deposit the device structure on a suitable substrate. The dopant concentration in the p+ selector and collector layers are about 100 to 10000 times higher than the doping level in the n− absorber which is typically doped in $10^{14}$ to $10^{15}$ cm$^{-3}$ level.

Figure 2:
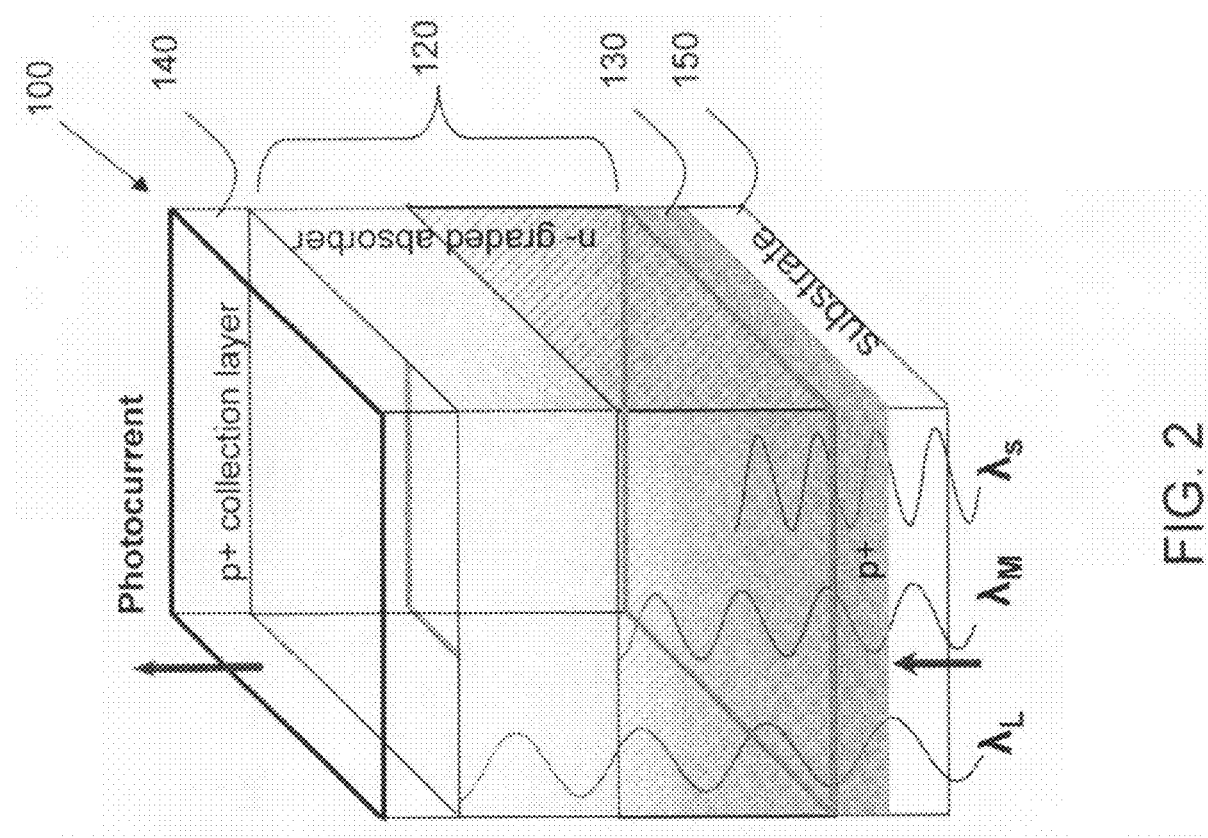
FIG. 2 is another schematic diagram of a photon detector pursuant to aspects of the present invention.

Referring to FIG. 2, a photon detector 100 includes a semiconductor graded absorber (or graded absorber layer) 120, a semiconductor collector (or collection) layer 140, and a semiconductor selector layer 130. Here, the graded absorber 120 is adapted to photo-generate charge carriers, and is graded in composition. That is, the graded absorber 120 is adapted to generate charge carriers though interaction with photon radiation having various wavelengths, such as a short wavelength $\lambda_S$, a medium wavelength $\lambda_M$, and a long wavelength $\lambda_L$. Due to the grading in the absorber 120, the longer wavelength photons, $\lambda_L$ are absorbed deeper in the absorber layer. The collector layer 140 is adapted to collect the photo-generated charge carriers, and the selector layer 130 is adapted to selectively deplete the absorber 120. The selector layer 130 has a same doping type as the collector layer 130 and an opposite doping type as the absorber 140. In the embodiment as shown in FIG. 2, the graded absorber 120 is an n− graded layer, the selector layer 130 is doped to be a p+ layer, and the collector layer 140 is doped to be a p+ layer. In this embodiment, the photogenerated holes are collected by the collector layer 140.

Figure 3:
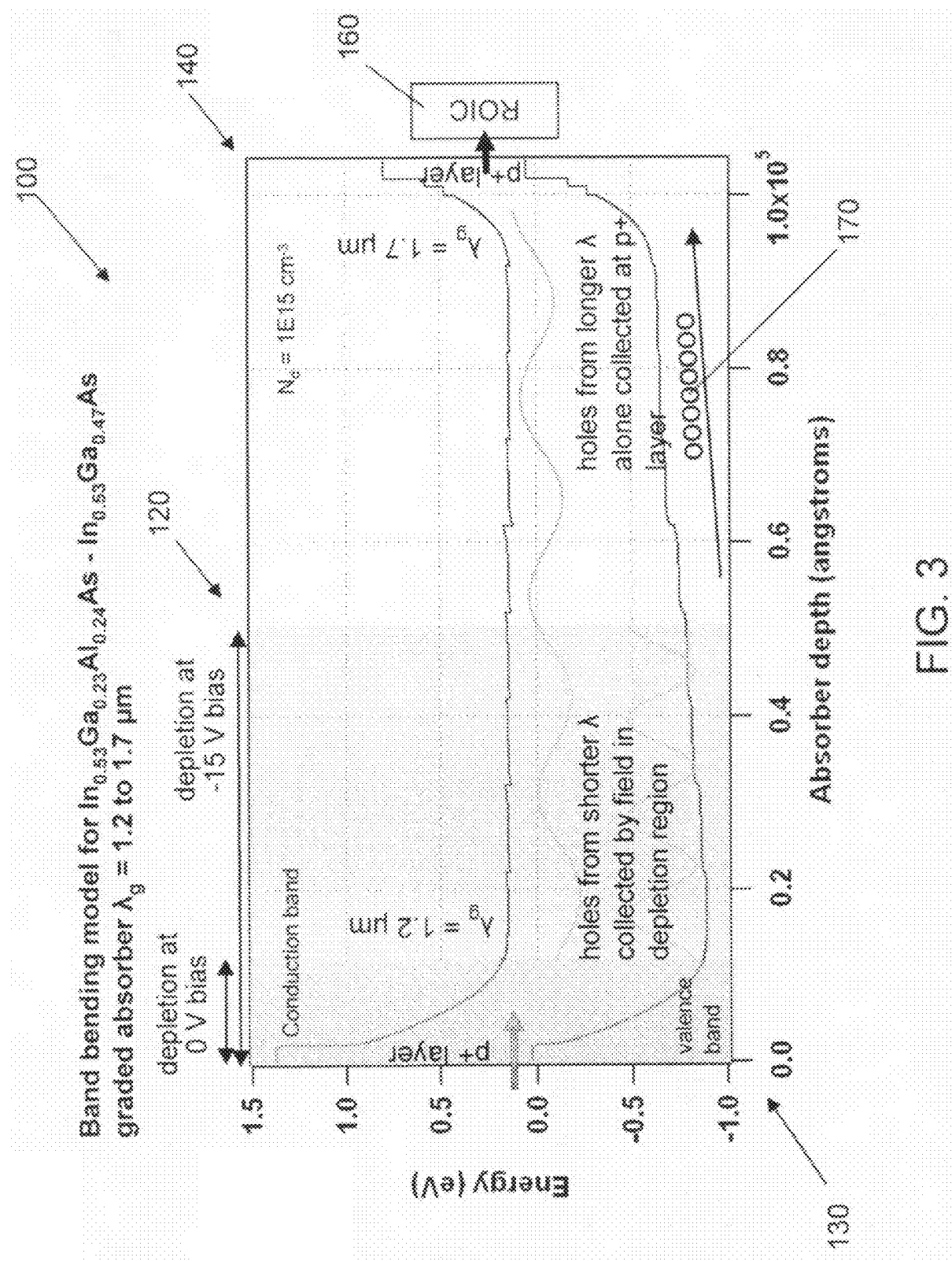
FIG. 3 illustrates band bending models for a graded InGaAlAs absorber that shows the collection of the shorter wavelength light upon application of 15 V of reverse bias to the p+ layer/n− absorber junction.

Moreover, referring now also to FIG. 3, in one embodiment of the present invention, the composition grade of the graded absorber 120 is away from the selector layer 130 such that the narrower band gap absorber material is closer to the collector layer 140 and the wider band gap absorber material is closer to the selector layer 130. The grade is such that the reduction in the bandgap is in the same direction as the incident photons. In one embodiment, the graded absorber layer includes substantially of InGa$_{1-x}$Al$_x$As, wherein x ranges from 0 to 1. Thus, since the composition grade of the absorber layer 120 is away from the selector layer 130, the composition would be varied from a lower value (wider band gap) to a higher value (narrower band gap) in a direction away from the selector layer 130 and towards the collector layer 140. In one embodiment, the graded absorber layer 120 can be either step-graded or linearly graded. In one embodiment, the graded absorber layer 120 includes multiple layers of materials.

Further, the magnitude of the reverse bias (e.g., 0V or −15V) applied to the p/n junction that is composed of the selector layer 130 and the absorber 120 changes the spectral response of the detector 100. In addition, the collector (or collection) layer 140 is a hole collection layer that is electrically connected to an ROIC 160.

Referring back to FIG. 2, in one embodiment, the selector layer 130 is formed on a substrate 150. In one embodiment, the substrate 150 is removed to extend a detection range of the detector to detect shorter wavelength electromagnetic radiation, that can include the visible light.

In addition, the substrate 150 according to one embodiment of the present invention can include a buffer layer to accommodate a lattice mismatch between the substrate 150 and the selector layer 130. In one embodiment, the substrate 150 including the buffer layer is removed to extend a detection range of the photon detector to detect shorter wavelength electromagnetic radiation, that can include the visible light.

More specifically, in a photon detector according to one embodiment, epitaxially grown graded InGaAlAs alloys (lattice matched to an InP substrate) are used as the absorber material to detect photons in the range from 0.83 μm to 1.8 μm at room temperature. The 0.83 μm cutoff of the detector at the short wavelength is imposed by absorption in the InAlAs which has a bandgap of 1.5 eV. In one embodiment, this requires the removal of the substrate for extending the detection range to <0.4 μm at the short wavelength end. Type II InGaAs/GaAsSb SLs will be used to extend the detection range to be from 1.8 to 2.5 microns. Alternatively, the addition of N to InGaAs can be used to extend the detection range. The bottom p+ layer serves to selectively deplete the graded absorber as a function of the reverse bias applied to the p+ layer/n− absorber junction. The hole collection layer located at the top is electrically connected to the ROIC. In one embodiment, the detection range can be further increased by using Sb-based alloys that are lattice-matched to InP. This would extend detection into the visible and ultraviolet (UV) portion of the spectrum. Examples of wide-band gap Sb-based alloys that are lattice matched to InP are listed below:

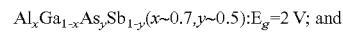

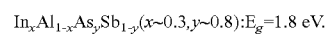

Operation Principle

In operation and referring back to FIGS. 2 and 3, due to the composition grade in the absorber (or absorber layer) 120 and the dependence of the absorption coefficient on the wavelength λ of IR radiation, shorter wavelength light will be absorbed closer to the substrate/absorber interface 150, 120, for back-side illuminated detection. On reverse biasing the p+ layer (located closest to the substrate 150)/n− absorber junction 130, 120, the depletion region spreads in the direction of the incident photons. The electric field in the depletion region results in the collection of the photogenerated holes at the p+ layer 130 (in FIG. 2, located at the bottom of the detector 100). Hence the photocurrent associated with the shortest wavelength does not reach ROIC 160. In this manner, the short wave component of the incident photons is selectively removed by collecting these photo-carriers generated within the depleted absorber. Holes 170 created farther away from the substrate 150 due to the larger effective penetration depth of the longer wavelength light are collected at the p+ hole collection layer 140 (in FIG. 2, located at the top of the detector 100). Hyperspectral detection is achieved by sweeping the magnitude of the reverse bias applied to a p+ layer/n− absorber 130, 120 and subtracting the detector signal from the reference broadband signal acquired at zero grid bias.

In one embodiment, to remove the photogenerated electrons and avoid unwanted transistor action, an n-type contact (e.g., 280, 380a, 380b, 480 in FIGS. 6, 7, and/or 8) is made to the n− region near the junction to the $p^+$ hole collection layer 140.

Hyperspectral vs. Broadband Modes of Operation

Referring still to FIGS. 2 and 3, in the absence of a reverse bias to the selector p+ layer/n− absorber 130, 120, the entire hole current associated with the broadband radiation is collected at the collection layer 140. This broadband signal can be designated as $I_0$. Shorter wavelength photons of wavelength $\lambda_1$ are absorbed close to the substrate 150 and the photocarriers are collected in the depletions region of the reverse biased p+/n− absorber junction 130, 120. In addition, $I_0-I_1$ can be used to designate the signal associated with photons with shorter wavelength, $\lambda_1$. Longer wavelength photons, $\lambda_2$, ($\lambda_2 > \lambda_1$) penetrate deeper and are collected in the wider depletion region of the absorber which is now biased with a larger reverse bias. Here, $I_0-I_2$ is used to designate the signal associated with photons with wavelength $<\lambda_2$. As such, $I_1-I_2$ can be used to designate the signal associated with the (narrow) $\lambda_2-\lambda_1$ band.

In one embodiment of the present invention, hyperspectral data are gathered by sweeping the reverse bias, and performing simple subtractive signal processing. This detector 100 is reconfigurable between the broadband as well as hyperspectral modes of operation. Broadband mode of operation is desirable for an application such as night vision using air glow emission at a wavelength range from 1.3 μm to 2.2 μm.

Also, in one embodiment of the present invention, the composition grade of the absorber 120 is configured such that photogenerated holes can diffuse towards the main p+collection layer 140, which is connected (or directly connected) to the ROIC 160 without encountering a hole barrier as is shown in FIGS. 2 and 3.

Moreover, in one embodiment of the present invention and as shown in FIG. 3, the absorber 120 is a graded InGaAlAs absorber. As shown, the bending model for the graded InGaAlAs absorber provides for the collection of the shorter wavelength light upon application of 15V of reverse bias to the p+ layer/n−absorber junction 130, 120. Here, only holes 170 created by longer wavelength light are sensed at the ROIC 160.

The following examples shown in Table 1 below illustrate the present invention in more detail. However, the present invention is not limited by these example. Table 1 provides calculation of the depletion width as a function of reverse bias and background doping. As shown, the critical breakdown fields are 48 V/μm for InP, and 22 V/μm for InGaAs. During detector operation, the field will be about ten times (10×) lower than the critical breakdown field.

| Material | $N_d$ (cm$^{-3}$) | Depletion width (μm) | $E_{max}$ (V/μm) | $E_{breakdown}$ (V/μm) |
|---|---|---|---|---|
| InP | 1.0E+15 | 1.4 at 0 V, 6.6 at −30 V bias | 4.7 at 30 V | 48 |
| InP | 5.0E+14 | 1.9 at 0 V, 9.3 at −30 V bias | 3.4 at 30 V | 48 |

-continued

| Material | $N_d$ (cm$^{-3}$) | Depletion width (μm) | $E_{max}$ (V/μm) | $E_{breakdown}$ (V/μm) |
|---|---|---|---|---|
| InP | 1.3E+14 | 3.8 at 0 V, 18.3 at −30 V bias | 1.7 at 30 V | 48 |
| InGaAs | 1.0E+15 | 1.0 at 0 V, 6.9 at −30 V bias | 4.4 at 30 V | 22 |
| InGaAs | 5.0E+14 | 1.5 at 0 V, 9.8 at −30 V bias | 3.2 at 30 V | 22 |
| InGaAs | 1.3E+14 | 3.0 at 0 V, 19.2 at −30 V bias | 1.6 at 30 V | 22 |

Figure 4:
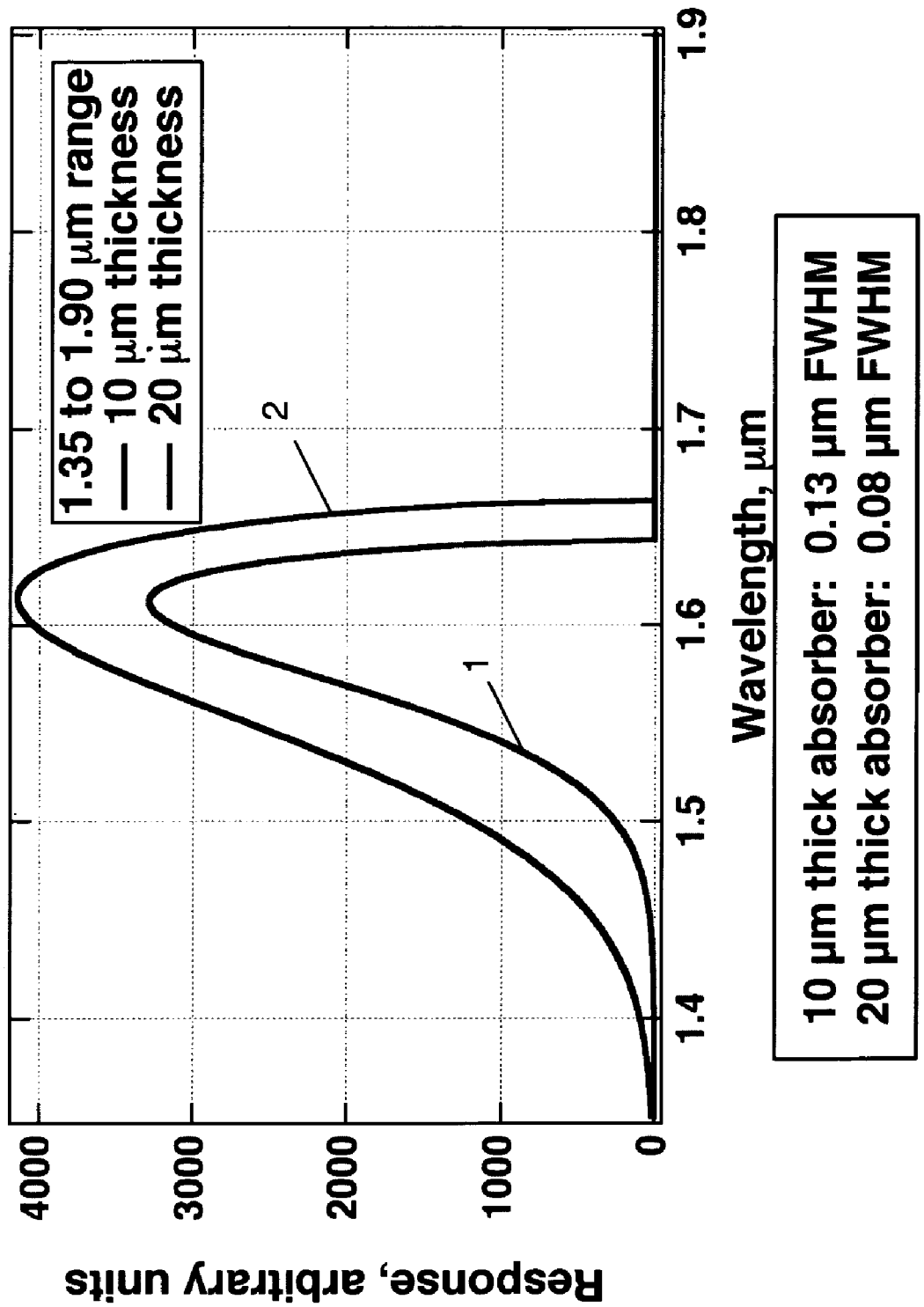
FIG. 4 illustrates a graph that simulates spectral response characteristics (in arbitrary units) with respect to a wavelength range (in μm) of a swept-depletion graded absorber sensor for a 10 μm thick absorber, and another that simulates spectral response characteristics (in arbitrary units) with respect to a wavelength range (in μm) of a swept-depletion graded absorber sensor a 20 μm thick absorber.

FIG. 4 illustrates a graph 1 that simulates spectral response characteristics (in arbitrary units) with respect to a wavelength range (in μm) of a swept-depletion graded absorber sensor for a 10 μm thick absorber, and a graph 2 that simulates spectral response characteristics (in arbitrary units) with respect to a wavelength range (in μm) of a swept-depletion graded absorber sensor a 20 μm thick absorber. As shown in FIG. 4, relatively thick absorber layers, such as the 20 μm thick absorber, can provide a spectral resolution of about 0.1 μm or less (FWHM In FIG. 4, the 20 μm thick absorber provides a spectral resolution of 0.08 μm while the 10 μm thick absorber provides a spectral resolution of 0.13 μm.

Figure 5:
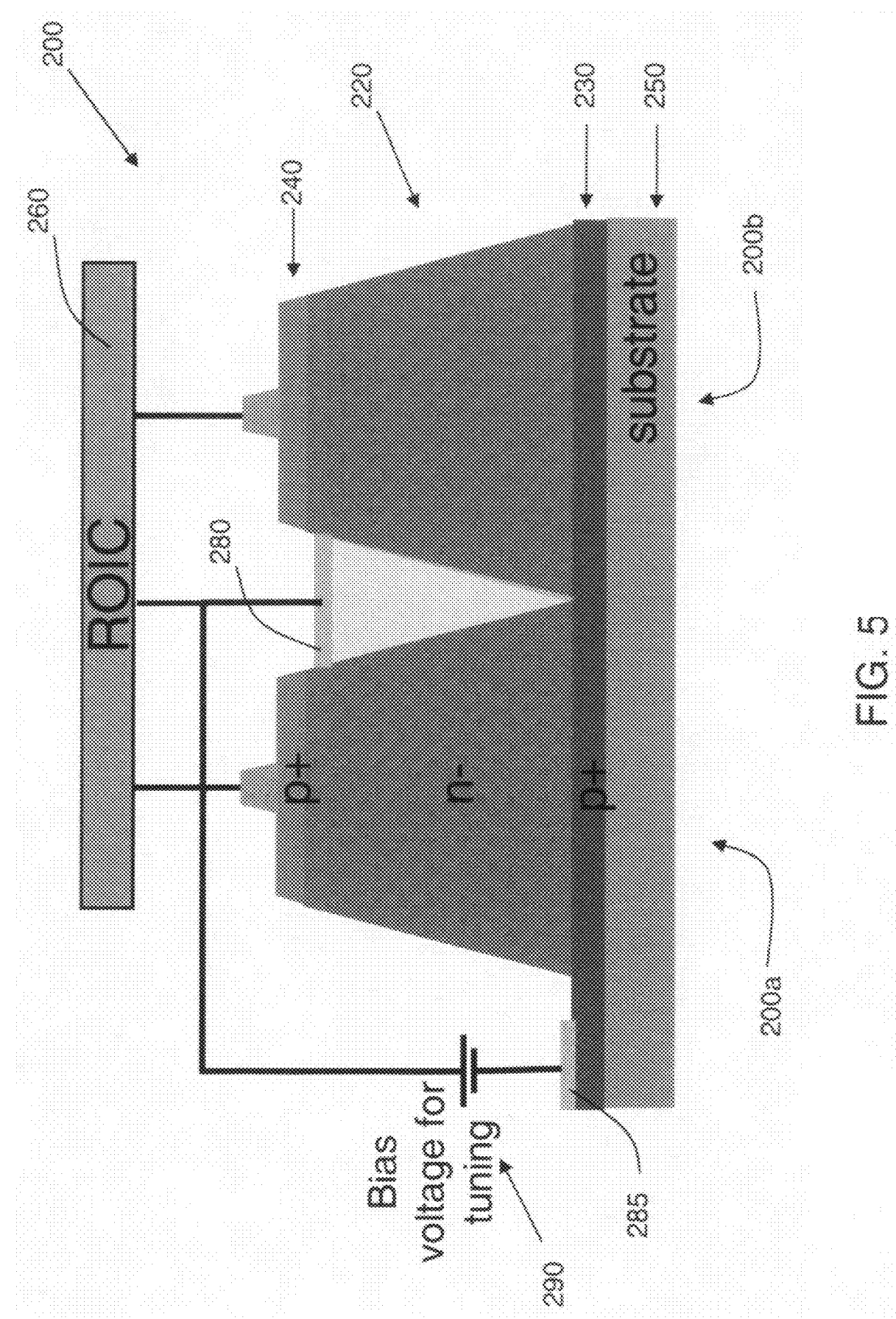
FIG. 5 is a schematic illustrating a fabricated detector with contacts according to an embodiment of the present invention.
Figure 6:
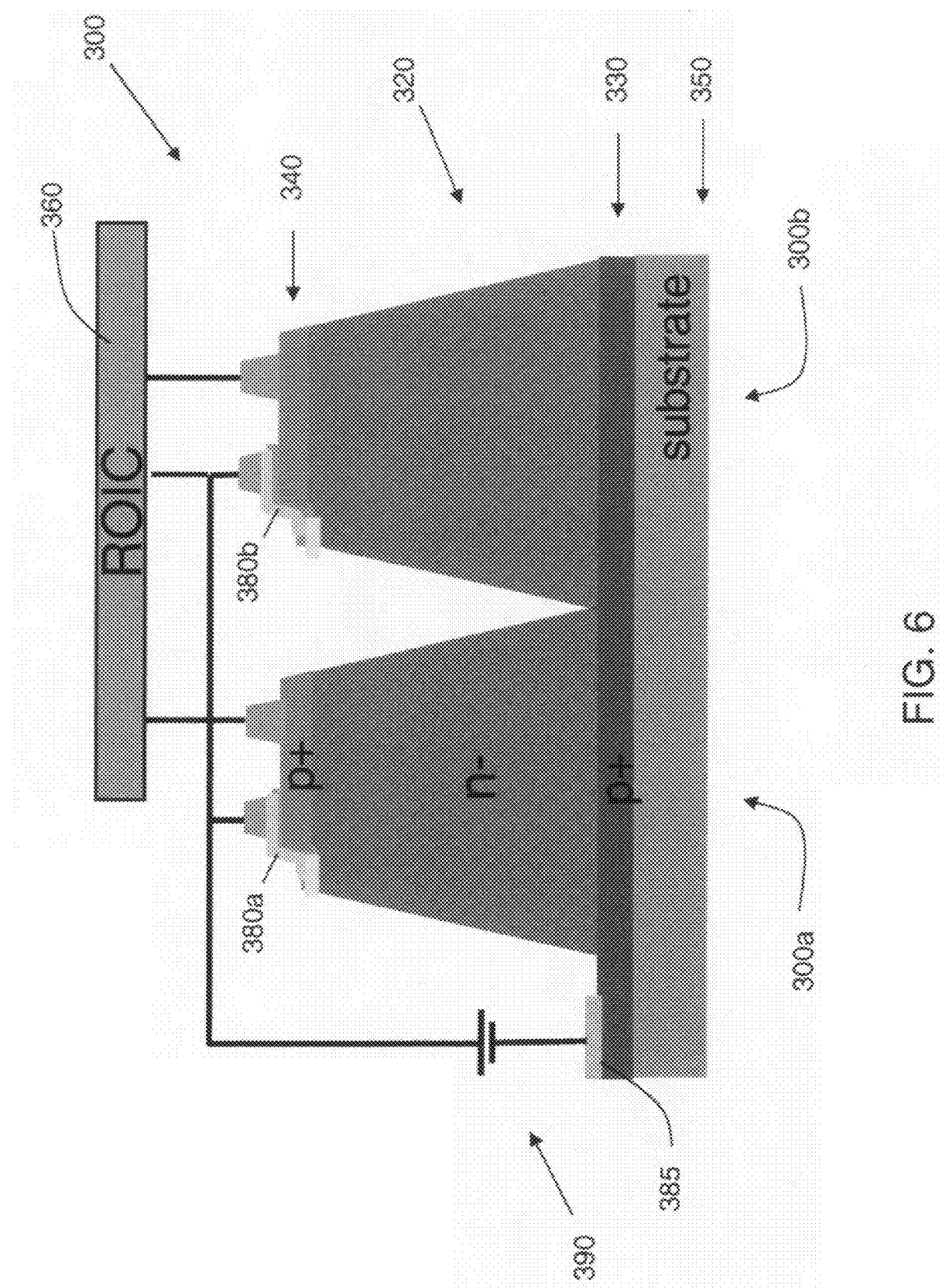
FIG. 6 is a schematic illustrating a fabricated detector with contacts according to another embodiment of the present invention.
Figure 7:
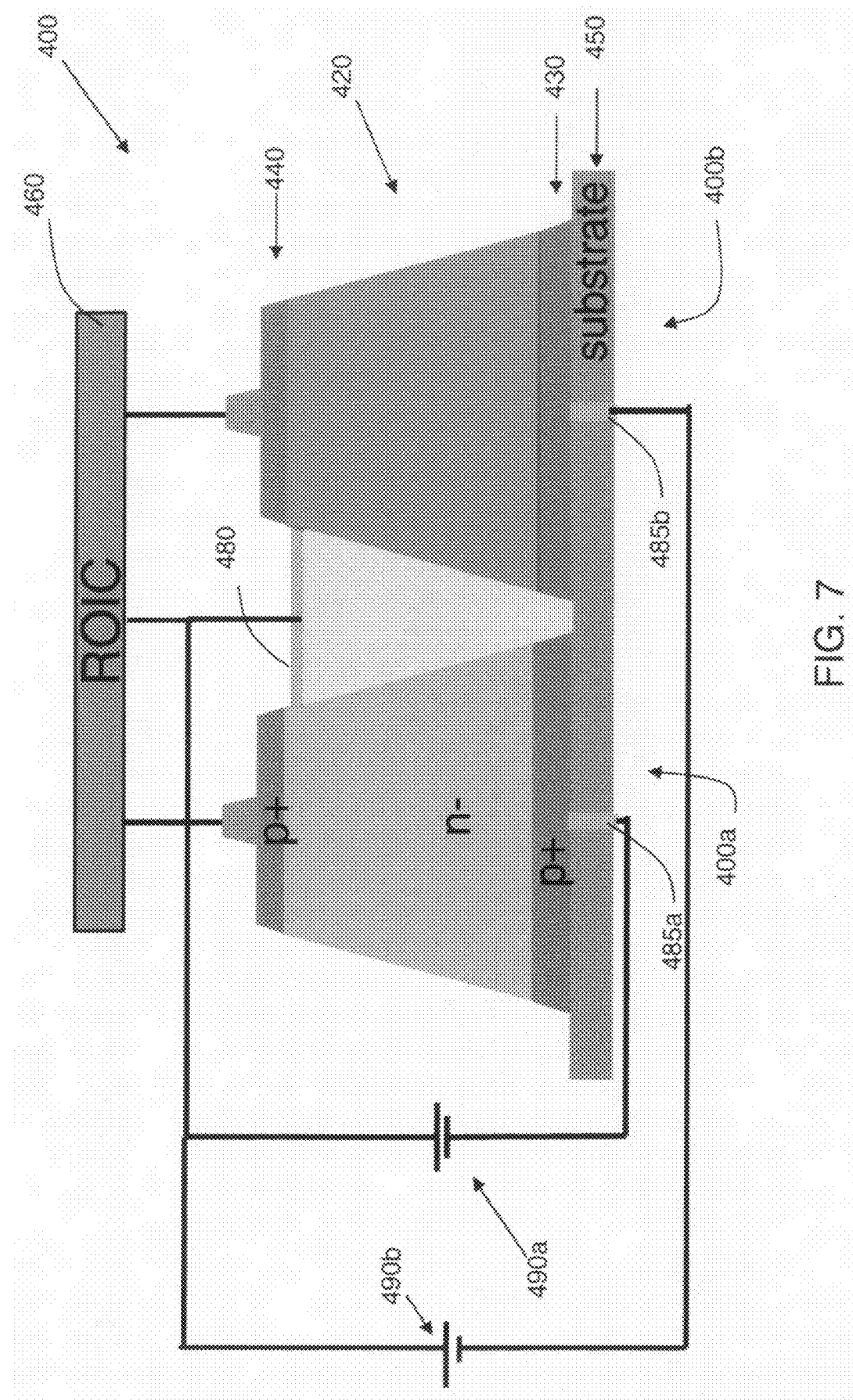
FIG. 7 is a schematic illustrating a fabricated detector with contacts according to yet another embodiment of the present invention.

FIGS. 5, 6, and 7 are schematics illustrating fabricated detectors with contacts. As shown in FIGS. 5, 6, and 7, a photon detector 200, 300, 400 includes a semiconductor graded absorber layer 220, 320, 420 adapted to generate charge carriers though interaction with infrared (IR) radiation. Here, the graded absorber layer 220, 320, 420 is graded in composition.

In addition, the photon detector 200, 300, 400 includes a semiconductor collector layer 240, 340, 440 adapted to collect the charge carriers, and a semiconductor selector layer 230, 330, 430 adapted to selectively deplete the absorber layer 220, 320, 420. The selector layer 220, 320, 420 has a same doping type as that of the collector layer 240, 340, 440 and an opposite doping type as the absorber layer 220, 320, 420. In more detail and as shown in FIGS. 5, 6, and 7, the graded absorber layer 220, 320, 420 contacts the collector layer 240, 340, 440 and the selector layer 230, 330, 430, and/or is interposed between the collector layer 240, 340, 440 and the selector layer 230, 330, 430. In one embodiment, the electromagnetic radiation to be detected enters the absorber layer 220, 320, 420 through the selector layer 230, 330, 430.

The grade is such that the reduction in the bandgap is in the same direction as the incident photons. Here, the composition grade of the absorber layer 220, 320, 420 is away from the selector layer 230, 330, 430 such that the narrower band gap absorber material is closer to the collector layer 240, 340, 440 and the wider band gap absorber material is closer to the selector layer 230, 330, 430. In one embodiment, the graded absorber layer includes substantially of $InGa_{1-x}Al_xAs$, wherein x ranges from 0 to 1. Thus, since the composition grade of the absorber layer 220, 320, 420 is away from the selector layer 230, 320, 420, the composition would be varied from a lower value (wider band gap) to a higher value (narrower band gap) in a direction away from the selector layer 230, 330, 430 and towards the collector layer 240, 340, 440. In one embodiment, the graded absorber layer 220, 320, 420 can be either step-graded or linearly graded. In one embodiment, the graded absorber layer 220, 320, 420 includes multiple layers of materials.

In the embodiments of FIGS. 5, 6, and 7, the magnitude of the reverse bias applied to the p/n junction that is composed of the selector layer 230, 330, 430 and the absorber layer 220, 320, 420 changes the spectral response of the detector 200, 300, 400.

An ROIC 260, 360, 460 is electrically coupled to the collector layer 240, 340, 440 as shown in FIGS. 5, 6, and 7. In one embodiment, the ROIC 260, 360, 460 is indium-bump-bonded to the collector layer 240, 340, 440.

Also, a bias voltage source 290, 390, 490 is electrically coupled to the selector layer 230, 330, 430 and the graded absorber layer 220, 320, 420 to tune a depletion width of the graded absorber layer 220, 320, 420. That is, the bias voltage source 290, 390, 490 configures the selector layer 230, 330, 430 to selectively deplete the graded absorber layer 220, 320, 420 to selectively detect a photon wavelength or, in one embodiment, an infrared wavelength.

A substrate 250, 350, 450 is also illustrated in FIGS. 5, 6, and 7. As shown, the selector layer 230, 330, 430 is on the substrate 250, 350, 450, wherein the graded absorber layer 220, 320, 420 is on the selector layer 230, 330, 430, and wherein the collector layer 40, 340, 440 is on the graded absorber layer 220, 320, 420.

Moreover, in FIGS. 5, 6, and 7, the detector 200, 300, 400 is shown to include one or more detector elements (or pixel elements) 200a, 200b, 300a, 300b, 400a, 400b that are fabricated to form a 2D FPA. In one embodiment as shown in FIGS. 5, 6, and 7, independent electrical contacts are made to the selector layer 230, 330, 430, the absorber layer 220, 320, 420, and the collector layer 240, 340, 440 to permit the biasing of the two p/n junctions independently. That is, the bias voltage source 290, 390, 490 provides a first bias to tune a depletion width at a selector layer/absorber layer p/n junction, and the ROIC 260, 360, 460 provides a second bias to provide a hole collection width at a collector layer/absorber layer p/n junction.

In addition, a different magnitude of bias can be applied to each of the detector elements 200a, 200b, 300a, 300b, 400a, 400b of the FPA to provide wavelength tunability at a pixel level.

In more detail and according to one embodiment of the present invention, FIG. 5 shows a first contact 280 electrically coupled to the absorber layer 220 near the junction to the collection layer 240, and a second contact 285 electrically coupled to selector layer 230. As shown in FIG. 5, the first and second contacts 280, 285 are used to apply a bias from the bias voltage source 290 to tune the depletion width for both first and second detector elements 200a, 200b.

According to another embodiment, FIG. 6 shows a first contact 380a electrically coupled to the absorber layer 320 of a first detector element 300a, and a second contact 380b electrically coupled to the absorber layer 320 of a second detector element 300b. In addition, a third contact 385 is electrically coupled to selector layer 330. Here, in FIG. 6, the first and third contacts 380a, 385 are used to apply a first bias from the bias voltage source 390 to tune the depletion width for the first detector element 300a, and the second and third contacts 380b, 385 are used to apply the bias from the bias voltage source 390 to tune the depletion width for the second detector element 300b. This embodiment uses a common global bias for all pixels.

According to yet another embodiment, FIG. 7 shows a first contact 480 electrically coupled to the absorber layer 420 of first and second detector elements 400a, 400b, a second contact 485a electrically coupled to the selector layer 430 of the first detector element 300a, and a third contact 485b electrically coupled to the selector layer 430 of the second detector element. Here, in FIG. 7, the first and second contacts 480, 485a, respectively, are used to apply a first bias from the bias voltage source 490a to tune the depletion width for the first detector element 400a, and the first and third contacts 480, 485a, respectively, are used to apply a second bias from the bias voltage source 490b to tune the depletion width for the second detector element 400b. As such, by independently contacting the lower side of each detector element, through a multiplexer, the reverse depletion bias in FIG. 7 can be independently varied to facilitate pixel-level wavelength tunability.

In one embodiment of the present invention, the substrate (e.g., 150, 250, 350, 450) is removed to extend a detection range of the photon detector to detect a visible light. Also, in one embodiment, a part of the graded absorber layer (e.g., 20, 120, 220, 320, 420) may include substantially of $In_{0.525}Ga_{1-x}Al_xAs$, wherein x ranges from 0 to 0.475. In one embodiment, a part of the graded absorber layer (e.g., 20, 120, 220, 320, 420) includes substantially of $Al_xGa_{1-x}As_ySb_{y-1}$, wherein x is about 0.75 and y is about 0.55. In one embodiment, a part of the graded absorber layer (e.g., 20, 120, 220, 320, 420) includes substantially of $InAl_{1-x}As_ySb_{y-1}$, wherein x is about 0.31 and y is about 0.82. In one embodiment, a part of the graded absorber layer (e.g., 20, 120, 220, 320, 420) includes substantially of $In_xAl_{1-x}As$, wherein x is about 0.52. In one embodiment, a part of the graded absorber layer (e.g., 20, 120, 220, 320, 420) includes substantially of $In_xGa_{1-x}As_yP_{y-1}$, that is lattice matched to InP. In one embodiment, a part of the graded absorber layer (e.g., 20, 120, 220, 320, 420) includes substantially of an alloy of $Hg_{1-x}Cd_xTe$ wherein x ranges from 0.2 to 1.0. In another embodiment, a part of the graded absorber layer (e.g., 20, 120, 220, 320, 420) includes substantially of an alloy of GaN, and/or one or more elements chosen from In, Al and As, alloyed with GaN to enable hyperspectral detection in the ultraviolet.

Moreover, in one embodiment, a first part of the graded absorber layer (e.g., 20, 120, 220, 320, 420) includes substantially of $Al_aGa_{1-a}As_bSb_{b-1}$, wherein a is about 0.75 and b is about 0.55; a second part of the graded absorber layer (e.g., 20, 120, 220, 320, 420) includes substantially of $In_cAl_{1-c}As_dSb_{d-1}$, wherein c is about 0.31 and d is about 0.82, a third part of the graded absorber layer (e.g., 20, 120, 220, 320, 420) includes substantially of $In_eAl_{1-e}As$, wherein e is about 0.52, and/or a fourth part of the graded absorber layer (e.g., 20, 120, 220, 320, 420) may include substantially of $In_{0.525}Ga_{1-x}Al_xAs$, wherein x ranges from 0 to 0.475.

Figure 8:
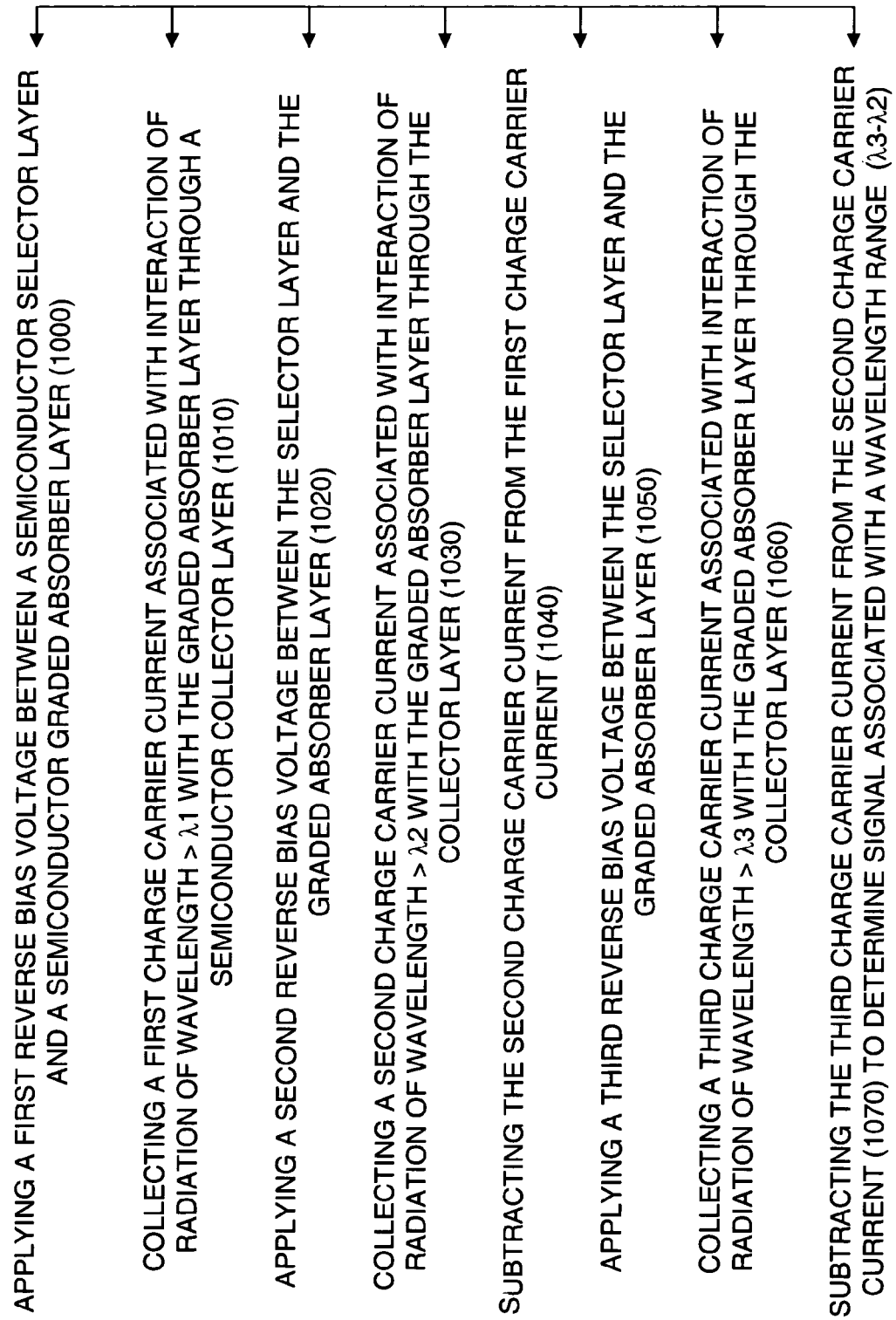
FIG. 8 is a block diagram illustrating a method to acquire hyperspectral and/or broadband imagery according to an embodiment of the present invention.

FIG. 8 shows a method to acquire hyperspectral and/or broadband imagery according to an embodiment of the present invention. As illustrated in FIG. 8 (with reference to FIG. 3), a first reverse bias voltage is applied between a semiconductor selector layer and a semiconductor graded absorber layer in block 1000. In block 1010, a first charge carrier current associated with a broadband radiation is collected from the graded absorber layer through a semiconductor collector layer.

Also, in one embodiment, a second reverse bias voltage is applied between the selector layer and the graded absorber layer in block 1020, and a second charge carrier current associated with the radiation of wavelength $>\lambda_1$ is collected from the graded absorber layer through the collector layer in block 1030. In block 1040, the second charge carrier current is subtracted from the first charge carrier current. Further, in block 1050, a third reverse bias voltage is applied between the selector layer and the graded absorber layer, and a third charge carrier current associated with the radiation of wavelength $>\lambda_2$ is collected from the graded absorber layer through the collector layer in block 1060. In block 1070, the third charge carrier current is subtracted from the second charge carrier current to get the signal associated with a narrow wavelength of $\lambda_2-\lambda_d$.

In one embodiment, the first reverse bias voltage is 0V, the second reverse bias voltage is lower in voltage level than the first reverse bias voltage, and the third reverse bias voltage is lower in voltage level than the second reverse bias voltage. In one embodiment, the bias voltage is periodically swept in a continuous manner between 0V and a voltage value needed to deplete the absorber layer.

In view of the foregoing, certain embodiments of the present invention provide methods and systems for depleting a graded absorber to achieve wavelength selective detection, reconfigurability between hyperspectral and multi-spectral modes of operation, pixel isolation and connection schemes, wavelength tunability at the pixel level using a multiplexer, sweeping the bias and associated signal processing scheme to acquire hyperspectral imagery, and/or extending detection range into the visible and the ultraviolet through substrate removal and the use of:

$Al_xGa_{1-x}As_ySb_{1-y}$ (x=0.75, y=0.55) $E_g$=2.16 eV, $\lambda$=0.57 μm;

$In_xAl_{1-x}As_ySb_{1-y}$ (x=0.31, y=0.82) $E_g$=1.77 eV, $\lambda$=0.70 μm; and/or $In_xAl_{1-x}As$ (x=0.52) $E_g$=1.5 eV, $\lambda$=0.83 μm.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A photon detector comprising:
   a semiconductor graded absorber layer adapted to photo-generate charge carriers, the graded absorber layer having a composition grade;
   a semiconductor collector layer adapted to collect the photo-generated charge carriers; and
   a semiconductor selector layer adapted to selectively deplete the absorber layer, the selector layer having a same doping type as the collector layer and an opposite doping type as the absorber layer,
   wherein the composition grade of the absorber layer is away from the selector layer such that a narrower band gap absorber material is closer to the collector layer and a wider band gap absorber material is closer to the selector layer, wherein the electromagnetic radiation to be detected enters the absorber layer through the selector layer, wherein a p/n junction composed of the selector layer and the absorber layer is configured to change the spectral response of the detector in accordance with the magnitude of a reverse bias applied to the p/n junction, wherein the graded absorber layer is interposed between the collector layer and the selector layer, wherein the graded absorber layer contacts the collector layer and the selector layer, and wherein independent electrical contacts are made to the selector layer, the absorber layer and the collector layer.

2. The photon detector of claim 1, wherein the selector layer is formed on a substrate, and wherein the substrate is removed to extend a detection range of the photon detector to detect shorter wavelength electromagnetic radiation that can include the visible light.

3. The photon detector of claim 1, wherein the selector layer is formed on a substrate, and wherein the substrate includes a buffer layer.

4. The photon detector of claim 3, wherein the substrate including the buffer layer is removed to extend a detection range of the photon detector to detect shorter wavelength electromagnetic radiation that can include the visible light.

5. The photon detector of claim 1, wherein a part of the graded absorber layer is comprised substantially of $In_{0.525}Ga_{1-x}Al_xAs$, and wherein x ranges from 0 to 0.475.

6. The photon detector of claim 1, wherein a part of the graded absorber layer is comprised substantially of $Al_xGa_{1-x}As_ySb_{1-y}$, has a band gap of ~2 eV, is lattice matched to InP, and wherein x is about 0.75 and y is about 0.55.

7. The photon detector of claim 1, wherein a part of the graded absorber layer is comprised substantially of an alloy of InGaAs that is lattice matched to InP.

8. The photon detector of claim 1, wherein a part of the graded absorber layer is comprised substantially of $In_xAl_{1-x}As_ySb_{1-y}$, and has a band gap of ~1.8 eV, is lattice matched to InP, and wherein x is about 0.31 and y is about 0.82.

9. The photon detector of claim 1, wherein a part of the graded absorber layer is comprised substantially of $In_xAl_{1-x}As$, and wherein x is about 0.52.

10. The photon detector of claim 1, wherein a first part of the graded absorber layer is comprised substantially of $In_{0.525}Ga_{1-x}A_xAs$ and x ranges from 0 to 0.475, wherein a second part of the graded absorber layer is comprised substantially of $In_eAl_{1-e}As$ and e is about 0.52, wherein a third part of the graded absorber layer is comprised substantially of $In_cAl_{1-c}As_dSb_{d-1}$ wherein and c is about 0.31, d is about 0.82, and wherein a fourth part of the graded absorber layer is comprised substantially of $Al_aGa_{1-a}As_bSb_{b-1}$, and a is about 0.75, b is about 0.55.

11. The photon detector of claim 1, wherein a part of the graded absorber layer is comprised substantially of an alloy of $Hg_{1-x}Cd_xTe$, and wherein x ranges from 0.18 to 1.0.

12. The photon detector of claim 1, wherein a part of the graded absorber layer is comprised substantially of GaN.

13. The photon detector of claim 1, wherein a part of the graded absorber layer is comprised of at least one element alloyed with GaN and selected from the group consisting of In, Al and As.

14. The photon detector of claim 1, wherein a part of the graded absorber layer is comprised substantially of GaN and at least one element alloyed with GaN and selected from the group consisting of In, Al and As.

15. The photon detector of claim 1, wherein the detector comprises an array of detector elements that are combined to form a focal plane array.

* * * * *